United States Patent [19]
Miyajima

[11] Patent Number: 5,731,231
[45] Date of Patent: Mar. 24, 1998

[54] SEMICONDUCTOR APPARATUS, FABRICATION METHOD THEREFOR AND BOARD FRAME

[75] Inventor: Kenji Miyajima, Kawasaki, Japan

[73] Assignee: Kabushiki Kaisha Toshiba, Kawasaki, Japan

[21] Appl. No.: 815,952

[22] Filed: Mar. 13, 1997

[30] Foreign Application Priority Data

Mar. 15, 1996 [JP] Japan .................. 8-087482

[51] Int. Cl.$^6$ .................. H01L 21/60
[52] U.S. Cl. .................. 438/124; 438/123; 438/125
[58] Field of Search .................. 438/123, 124, 438/125, 126, 127

[56] References Cited

U.S. PATENT DOCUMENTS

| | | |
|---|---|---|
| 5,336,639 | 8/1994 | Nagaraj et al. .................. 438/123 |
| 5,422,314 | 6/1995 | Sekiba .................. 438/123 |
| 5,474,958 | 12/1995 | Djennas et al. .................. 438/124 |
| 5,527,740 | 6/1996 | Golwalkar et al. .................. 438/123 |

*Primary Examiner*—Kevin Picardat
*Attorney, Agent, or Firm*—Finnegan, Henderson, Farabow, Garrett & Dunner, L.L.P.

[57] ABSTRACT

A semiconductor apparatus has a wiring board having a wiring pattern and a plurality of connection electrodes formed on a surface thereof with the connection electrodes being electrically connected to the wiring pattern. A semiconductor device is mounted on a main surface of the wiring board and electrically connected to the wiring pattern. A resin-sealed structure is formed by a transfer mold for coating the main surface of the wiring board and the semiconductor device and having sides with a predetermined taper angle after coating. Those side edge portions of the resin-sealed structure which contact the main surface of the wiring board are in contact with edge portions of respective sides of the wiring board.

6 Claims, 7 Drawing Sheets

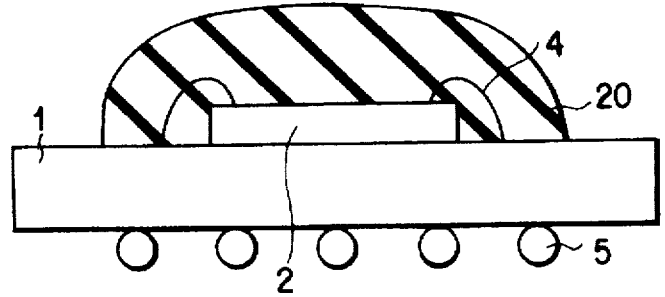
F I G. 1B
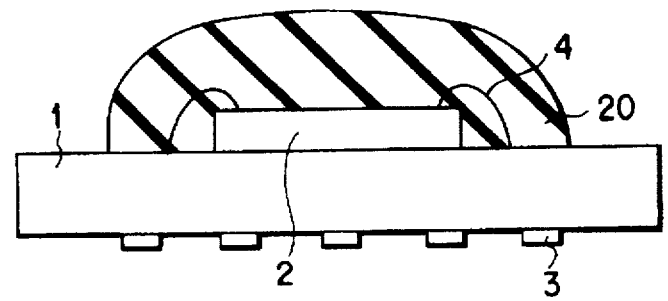
F I G. 1C
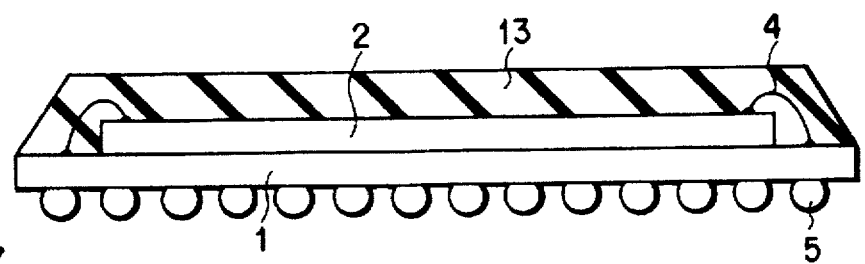
F I G. 3
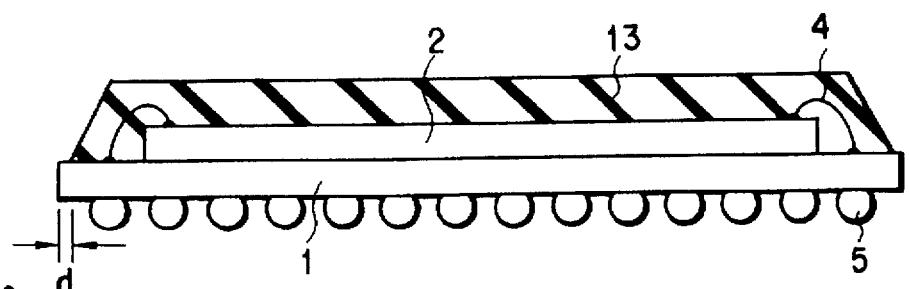
F I G. 4

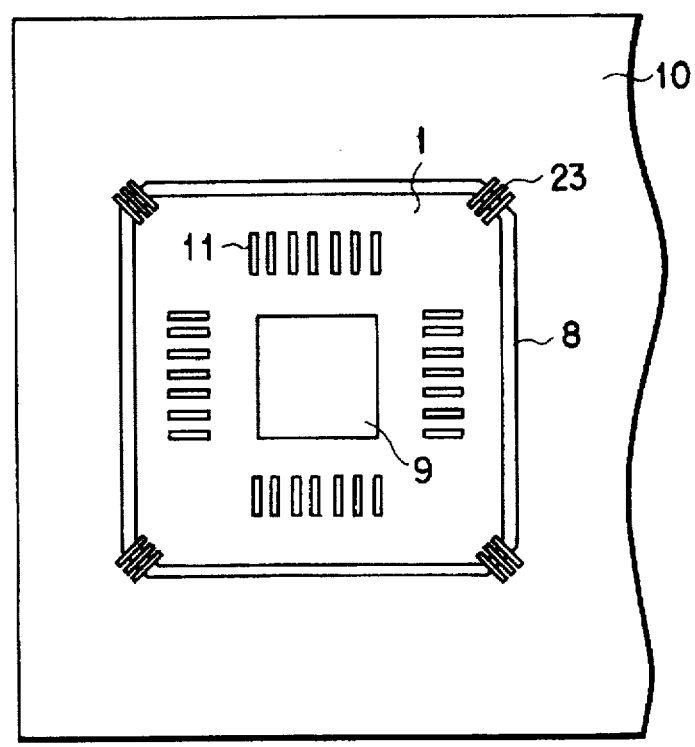
F I G. 11
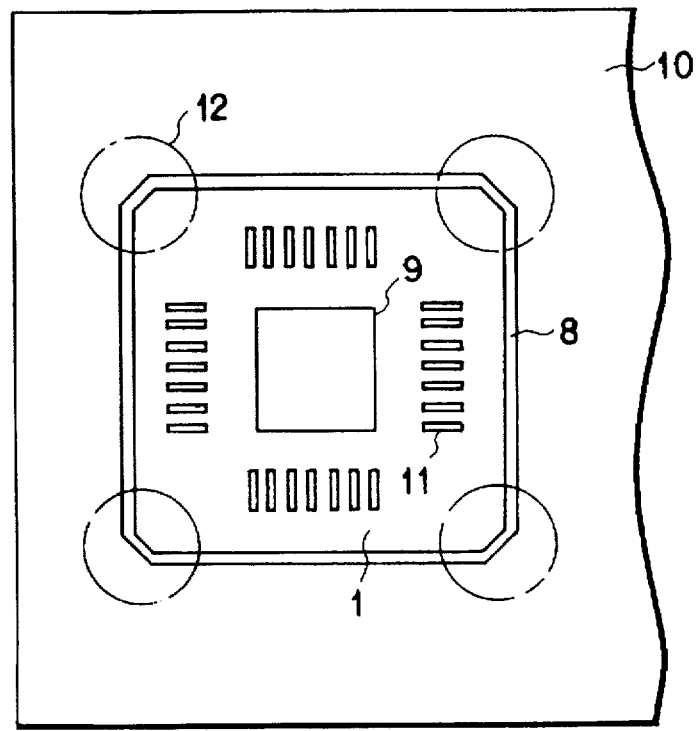
F I G. 12

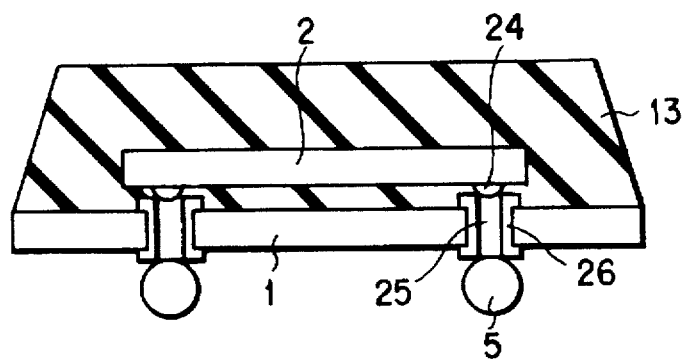
F I G. 13
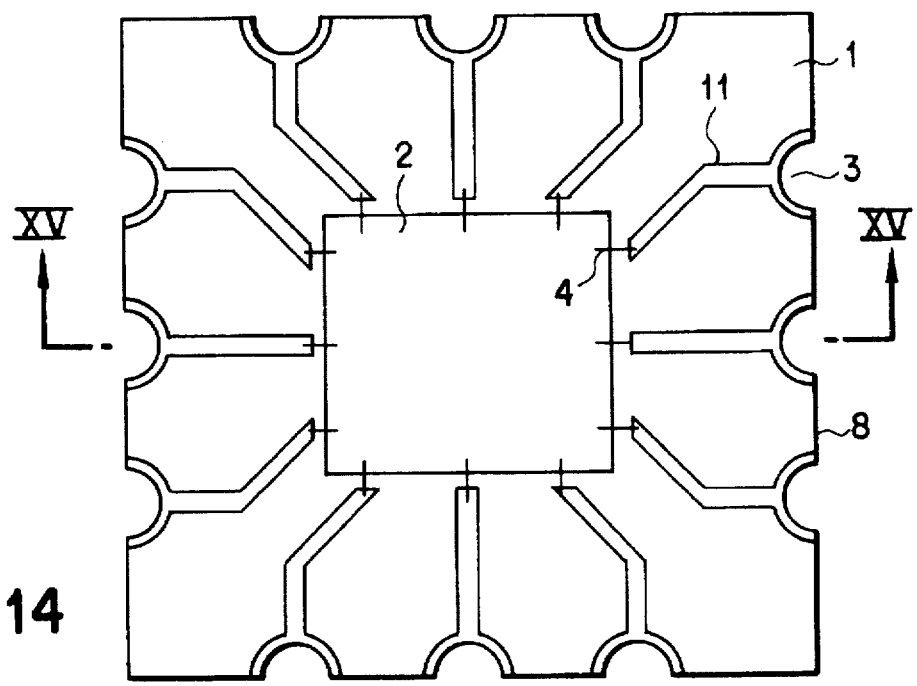
F I G. 14
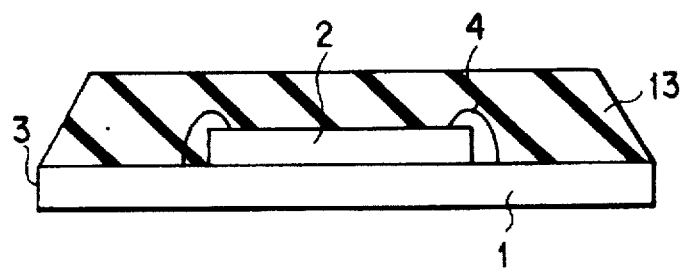
F I G. 15

5,731,231

SEMICONDUCTOR APPARATUS, FABRICATION METHOD THEREFOR AND BOARD FRAME

BACKGROUND OF THE INVENTION

The present invention relates to a flangeless semiconductor apparatus, and, more particularly, to a semiconductor apparatus having an FBGA (Fine pitch Ball Grid Array) board, a method of fabricating the same, and an improvement of a board frame.

Conventionally, semiconductor apparatuses are classified into a plastic type or non-airtight type which uses a resin airtight member and an airtight type which uses a ceramic or metal package.

While slightly suffering a lower reliability, the former type is more excellent in the productivity and economical aspect than the latter type and is thus more practical. In many resin-sealing type semiconductor apparatuses, a metal lead frame and a semiconductor chip mounted thereon are sealed with a mold resin like epoxy resin.

However, outer leads of the resin-sealed lead frame, which become external lead electrodes, are easily deformable at the led-out portions and such a lead frame is not suitable for the case where a plurality of semiconductor devices are to be mounted on the lead frame.

Recently, therefore, semiconductor devices are mounted on a wiring board comprised of an insulated board, such as a printed circuit board (PCB) comprised of a copper-plated lamination board, the connection electrodes of the semiconductor devices are electrically connected to the interconnection or wiring portions of the wiring board by wire bonding, and the resin formation is performed thereafter.

This copper-plated lamination board is supplied as being secured to a board frame as the wiring board, or in the form of a piece of the wiring board.

A potting technique and a transfer molding technique, for example, are two of known methods of forming a resin-sealed structure for packaging semiconductor devices.

The potting technique is to drop a given amount of liquid resin of an epoxy group, silicon group or the like on semiconductor devices, which are securely mounted on a wiring board and have connection electrodes electrically connected to the wiring portions of this wiring board, and then subjecting the resultant structure to heat hardening.

The resin-sealed structure which is formed by this potting technique is expensive and has such a possibility that the resin-sealed structure may spread more than the determined area and be fixed so at the time of fabrication. Further, it is difficult to set the resin-sealed structure to the desired thickness.

The transfer molding technique is a method of forming a thermosetting resin, which thermosets a resin material in a heating chamber. A semiconductor device to be mounted on a wiring board has connection electrodes electrically connected to the wiring portions. This semiconductor device is placed together with the wiring board in a heated die cavity, and the thermoset resin material is pressed fit in this die cavity and a resin-sealed structure is yielded.

Referring to FIGS. 1A to 1C, a description will be given of a semiconductor apparatus, which has a semiconductor device supported on a wiring board and is formed by the conventional potting technique.

FIGS. 1A to 1C are cross-sectional views of semiconductor apparatuses each having a semiconductor device mounted on a wiring board. The wiring board 1 shown in FIG. 1A is a printed circuit board (PCB) which has an interconnection or wiring pattern (inner leads) formed on the main surface of a copper-plated lamination board.

The copper-plated lamination board is manufactured by pressing and heating a lamination board obtained by laminating plates that include glass fiber cloths impregnated with an epoxy resin.

The copper foil which is formed on the surface of the lamination board is etched to form a wiring pattern. Formed on one side of the wiring board 1 are a plurality of connection electrodes 3 which are electrically connected inner leads (not shown) to be electrically connected to an external circuit.

The connection electrodes 3 are formed of a nickel-plated layer or a conductive layer which has a gold layer or a solder layer formed on a nickel-plated layer.

Connection electrodes (not shown) are also formed on the main surface of a semiconductor device 2, and are electrically connected to the wiring pattern by bonding wires 4 of gold, aluminum (Al) or the like.

The connection electrodes 3 of the wiring board 1 are connected to the wiring pattern. The semiconductor device 2 is electrically connected to an external circuit through the wiring pattern. A liquid resin like an epoxy resin is dropped on the semiconductor device 2 and the bonding wires 4. The liquid resin is hardened to become a resin-sealed structure 20.

The wiring board 1 shown in FIG. 1B is comprised of a printed circuit board which is a copper-plated lamination board having inner leads (not shown). Formed at the back of the wiring board 1 are bump electrodes 5 like solder portions which are electrically connected to the inner leads to be electrically connected to an external circuit.

The inner leads on the main surface of the wiring board 1 are electrically connected to the solder bumps 5 at the back thereof via connection electrodes (not shown) which are formed on the inner surfaces of through holes (not shown) formed in the wiring board 1.

The solder bumps 5 are connected to the wiring pattern of a circuit board (not shown) on which another wiring board is mounted. Connection electrodes (not shown) are also formed on the main surface of a semiconductor device 2, and are electrically connected to the inner leads by bonding wires 4 of gold, aluminum or the like.

A liquid resin like an epoxy resin is dropped on the semiconductor device 2 and the bonding wires 4 by potting technique. The liquid resin is hardened to become a resin-sealed structure 20.

The wiring board 1 shown in FIG. 1C is comprised of a printed circuit board which is a copper-plated lamination board having inner leads (not shown). Formed at the back of the wiring board 1 are connection electrodes 3 like solder portions which are electrically connected to the inner leads to be electrically connected to an external circuit.

The inner leads on the main surface of the wiring board 1 are electrically connected to the connection electrodes 3 which extend to the inner surfaces of through holes (not shown) formed in the wiring board 1.

The connection electrodes 3 are connected directly to the wiring pattern of a circuit board (not shown) on which another wiring board is mounted. Each connection electrode 3 is comprised of a nickel-plated layer or a conductive layer which has a gold layer or a solder layer formed on a nickel-plated layer.

Connection electrodes (not shown) are also formed on the main surface of a semiconductor device 2, and are electrically connected to the inner leads by bonding wires 4 of gold, aluminum or the like. A liquid resin like an epoxy resin is dropped on the semiconductor device 2 and the bonding wires 4. The liquid resin is hardened to become a resin-sealed structure 20.

There is another way which uses a flip chip technique that connects bump electrodes attached to a semiconductor device to the inner leads of a wiring board without using bonding wires.

In the case where a resin-sealed structure is formed by the potting technique in the conventional type of supporting a semiconductor apparatus on a wiring board, as discussed above, not only the potting resin itself is expensive (because of low productivity, low resin efficiency, etc.) but also the resin-sealed structure is likely to spread more than the predetermined area. This requires that the wiring board should be designed larger than the area of the resin-sealed structure to form an extra area, not covered with the resin-sealed structure, on the peripheral portion of the wiring board.

As the surface tension of the resin works intensively and the resin flows and spreads more than the resin-sealed area in this potting technique, it is difficult to provide a high dimensional precision in the height direction (thickness precision), thus making it difficult to control the resin-sealed structure to the desired thickness.

According to the transfer molding technique, which uses a die, a thin resin-sealed structure can be formed in the desired resin-sealed area and without becoming unnecessarily thicker. Further, this method can manufacture resin-sealed structure at low cost.

Since this wiring board is fixed in a die to undergo a resin-sealing process and is separated after resin-sealing, however, the wiring board should be held in the transfer mold by some means in the molding step and a portion necessary to hold the wiring board (normally, requiring six to eight times the thickness of the board) should be formed in the cutting die around the resin-sealed structure in the cutting process.

This holding portion however becomes a great obstruction to the miniaturization of semiconductor apparatuses.

For a BGA (Ball Grid Array) board having a ball pitch of 1.27 mm, for example, the board frame portion at the time of punching the board frame out of the separated resin-sealed structure remains as a flange.

For an FBGA board having a ball pitch of 0.8 mm, however, the remaining flange portion stands in the way of miniaturization. To provide such a fine pitch of an FBGA board, therefore, a flangeless structure is desirable in accomplishing miniaturization.

However, no attempt has been made in the conventional FBGA boards to acquire a smaller board frame by pushing back a flangeless wiring board to the original position of the board frame and holding it there. To "push back" the wiring board is to move the wiring board once removed from the board frame, back to the very position the wiring board assumed before removed from the board frame, and fix and hold the wiring board in the board frame. The term "push back system," which will be used later, means a system in which a wiring board is so moved and so held in a board frame.

BRIEF SUMMARY OF THE INVENTION

Accordingly, it is an object of the present invention to provide a semiconductor apparatus which has a semiconductor device on a wiring board in a resin-sealed fashion and has a smaller package by acquiring a smaller board frame by pushing back a flangeless wiring board to the original position of the board frame and holding it there, an optimum semiconductor apparatus fabrication method for use in a transfer molding step which has a high productivity and a high reliability at low economy, and a board frame for use in this fabrication method.

To achieve the above object, a semiconductor apparatus according to this invention comprises:

a wiring board having a wiring pattern and a plurality of connection electrodes formed on a surface the wiring board and electrically connected to the wiring pattern;

a semiconductor device mounted on the wiring board and electrically connected to the wiring pattern; and a resin transfer molding covering the surface of the wiring board and the semiconductor device, having inclined side surfaces, and having side edge portions contacting the surface of the wiring board and edge portions of respective sides of the wiring board.

A method of fabricating a semiconductor apparatus according to this invention comprises the steps of:

forming a plurality of wiring boards each having a wiring pattern and a plurality of connection electrodes electrically connected to the wiring pattern, on a board frame and punching the board frame according to each wiring board to make a plurality of wiring boards;

pushing back the punched-out wiring boards to original positions of the board frame at which time glass fibers at contact surfaces of the wiring boards and the board frame, which have been produced at a time of punching the board frame, are entangled to hold the wiring boards and the board frame;

mounting semiconductor devices on the surfaces of the wiring boards;

electrically connecting the semiconductor devices to the wiring patterns;

forming transfer moldings, covering the surfaces of the wiring boards and the semiconductor devices mounted thereon; and separating the wiring boards from the board frame.

A board frame for a semiconductor apparatus according to this invention comprises:

an insulated board having a plurality of openings formed by punching a plurality of wiring board areas;

a plurality of wiring boards each having a wiring pattern and a plurality of connection electrodes electrically connected to the wiring pattern, the wiring boards being pushed back to the openings, and at which time glass fibers at contact surfaces of the wiring boards and the board frame, which have been produced at a time of punching the board frame, are entangled to hold the wiring boards and the board frame.

According to the semiconductor apparatus, the semiconductor apparatus fabrication method and the board frame according to this invention with the above structures, the edge portions of the bottom of the resin-sealed structure which contacts the wiring board are formed along the sides of the wiring board, i.e., the individual sides of the bottom of the resin-sealed structure match with the respective sides of the wiring board, so that the board frame portion at the time of punching the board frame out of the separated resin-sealed structure does not remain as a flange.

It is therefore possible to meet the requirement for miniaturization even in the case of a fine pitch structure having a ball pitch of 0.8 mm.

As the assembling steps are executed using a push-back type board frame comprised of a printed circuit board or the like, automation can be accomplished efficiently.

Further, at the time the punched-out wiring boards are pushed back to the original positions of the board frame, glass fibers at contact surfaces of the wiring boards and the board frame, which have been produced at the time of punching the board frame, are entangled to surely hold the wiring boards and the board frame.

As apparent from the above, this invention can significantly improve the ability of the push-back type board frame to hold the wiring boards.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1C are cross-sectional views of conventional semiconductor apparatuses each having a semiconductor device mounted on a wiring board;

FIG. 3 is a cross-sectional view of a semiconductor apparatus formed on a wiring board of this invention;

FIG. 4 is a cross-sectional view showing a modification of the semiconductor apparatus in FIG. 3;

FIG. 11 is a partial plan view of a wiring board which is held on the board frame and is provided with reinforcing sections;

FIG. 12 is a partial plan view of a wiring board which is held on the board frame and is provided with temporary tacking sections different in shape from those in FIGS. 9 and 10;

FIG. 13 is a partial cross-sectional view of a semiconductor apparatus according to this invention which is connected to a wiring board by flip-chip connection;

FIG. 14 is a plan view showing a semiconductor apparatus according to another embodiment of this invention; and FIG. 15 is a cross-sectional view as viewed from the direction of the line XV—XV in FIG. 14.

DETAILED DESCRIPTION OF THE INVENTION

Preferred embodiments of the present invention will now be described with reference to FIGS. 2 through 15.

A printed circuit board, for example, is used for a board frame. First, heat-resistant glass cloths as base members are impregnated with an epoxy resin, the resultant base members are laminated and copper foils are adhered to both surfaces of the resultant structure. This copper-plated lamination board is used.

This copper-plated lamination board is subjected to a repetitive photoetching, boring, lamination and the like to form a predetermined circuit, thereby yielding a printed circuit board. Thereafter, this printed circuit board is cut to a desired shape for a QFN or BGA board to form a board frame holding wiring boards.

The individual cut wiring boards are set back to the board frame by using a push-back technique.

Figure 1A:
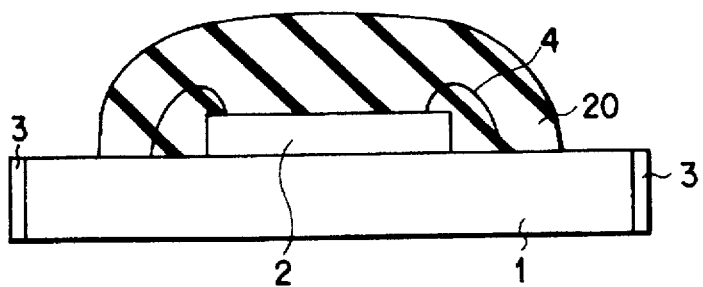
Figure 2:
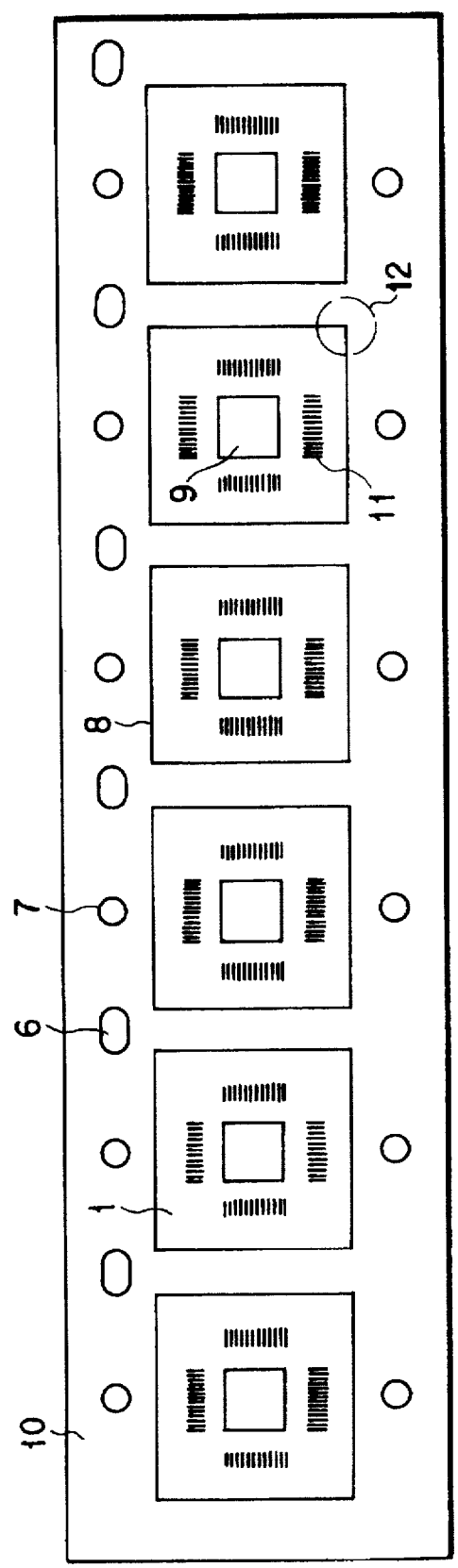
FIG. 2 is a plan view of a board frame according to this invention.

FIG. 2 is a plan view of a board frame according to this invention.

The board frame 10 has guide holes 6 made in one edge portion, arranged in a row and at predetermined intervals. The guide holes 6 are used to convey the board frame 10. The frame 10 also has two rows of positioning holes 7. The holes 7 of one row are made in one edge portion of the frame 10, each between two adjacent guide holes 6. The holes 7 of the other row are made in the other edge portion of the frame 10.

A plurality of wiring boards 1 are mounted on the board frame 10. The wiring boards 1 are arranged at predetermined intervals, forming a row. The row of the wiring boards 1 extends between the rows of positioning holes 7. The wiring boards 1 are formed by punching the board frame 10 and are pushed back to the openings which have been formed by this punching process. The board frame 10 has a thickness of about 0.45 mm.

Push-back lines 8 are formed at the boundaries between the wiring boards 1 and the board frame 10. Each wiring board 1 has an island 9 at the center where a semiconductor device is to be located, and an wiring pattern or inner leads 11 formed slightly apart from this island 9.

After the wiring boards 1 are pushed back to the board frame 10, temporary tacking sections 12 are formed at the boundary areas between the board frame 10 and the wiring boards 1 for the reinforcement purpose.

The temporary tacking sections 12 should be formed as needed, and may not be provided if unnecessary.

The temporary tacking sections 12 are formed by pressing or hitting the boundary areas. The temporary tacking sections 12 should be formed in the areas (margin portions) where the wiring patterns are not formed, e.g., in the vicinity of the corners of the wiring boards.

Pressing or hitting the boundary areas causes the board frame 10 and the wiring boards 1 to be pressed against each other, thus enhancing their holding power.

The temporary tacking section 12 for each wiring board 1 can be formed at more than one locations, and the number of the temporary tacking sections is determined by the required holding power.

A resin-sealed structure is formed on this wiring board 1 by an automation machine into which the board frame mounted with the wiring boards is conveyed.

Referring now to FIGS. 3 and 4, the semiconductor apparatus according to this invention will be described.

FIG. 3 is a cross-sectional view of a semiconductor apparatus formed on a wiring board of this invention. FIG. 4 is a cross-sectional view showing a modification of the semiconductor apparatus in FIG. 3.

As shown in FIG. 3, bump electrodes 5 like solder portions, which are electrically connected to the inner leads (not shown) formed on the main surface of the wiring board 1 and are to be electrically connected to an external circuit, are formed at the back of the wiring board 1 formed of the board frame 10 shown in FIG. 2.

A semiconductor device 2 is connected to the main surface of the wiring board 1. The wiring pattern or the inner leads on the main surface of the wiring board 1 are electrically connected to the solder bumps 5 at the back of the wiring board 1 via connection electrodes which are formed on the inner surfaces of through holes (not shown) formed in the wiring board 1.

The solder bumps 5 are connected to the wiring pattern of a circuit board (not shown) or the like on which another wiring board is mounted, at the time they are connected to an external circuit.

Connection electrodes are also formed on the main surface of the semiconductor device 2, and are electrically connected to the inner leads by bonding wires 4 of gold, aluminum or the like.

A resin-sealed structure 13 of an epoxy resin or the like, which is formed by a transfer mold is coated on the semiconductor device 2 and the bonding wires 4.

As the resin-sealed structure 13 is formed in a die by the transfer mold, its back is tapered.

For example, the taper angle is approximately 30 degrees to the perpendicular direction. The individual sides of the bottom of the resin-sealed structure 13 are laid out along the respective sides of the wiring board 1. That is, the main surface of the wiring board 1 is substantially the same in shape and size as the bottom of the resin-sealed structure 13.

This is achieved by placing the board frame in a die in such a way that the sides of the cavity of the die coincide with the push-back lines.

If the area of the bottom of the resin-sealed structure 13 becomes larger than the area of the main surface of the wiring board 1 even slightly, the resin-sealed structure 13 is likely to be broken or damaged.

If the sides of the bottom of the resin-sealed structure 13 are set back from the respective sides of the main surface of the wiring board 1 by a distance (d) of about 0.1 mm, the former sides and the latter sides can be considered as substantially the same.

The fabrication steps for the semiconductor apparatus in FIG. 3 will be discussed below.

Figure 5A:
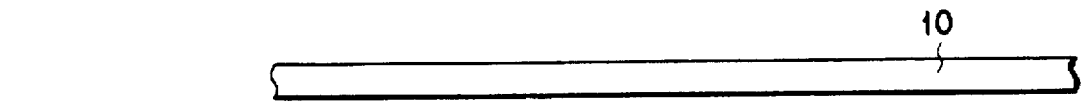
FIGS. 5A to 5C are cross-sectional views illustrating fabrication steps of holding the wiring board of the semiconductor apparatus of this invention to the board frame by a push-back technique.
Figure 5B:
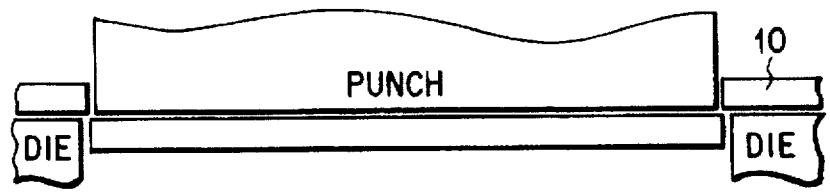
Figure 5C:

FIGS. 5A to 5C are cross-sectional views illustrating the fabrication steps for the board frame 10 of this semiconductor apparatus.

Figure 6A:
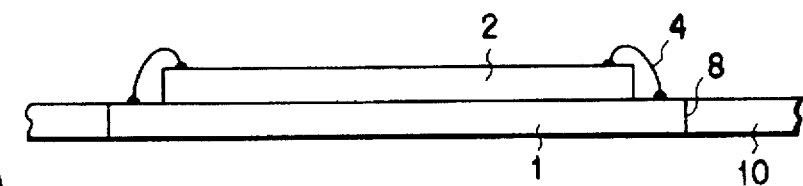
FIGS. 6A to 6C are cross-sectional views illustrating fabrication steps of the semiconductor apparatus of this invention.
Figure 6B:
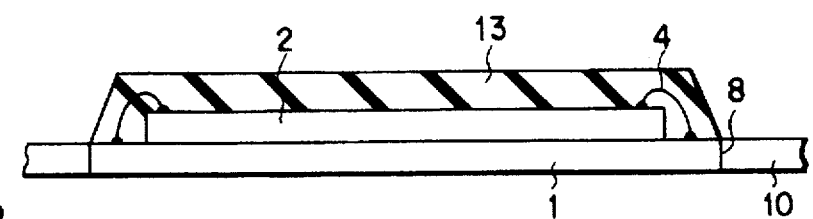
Figure 6C:
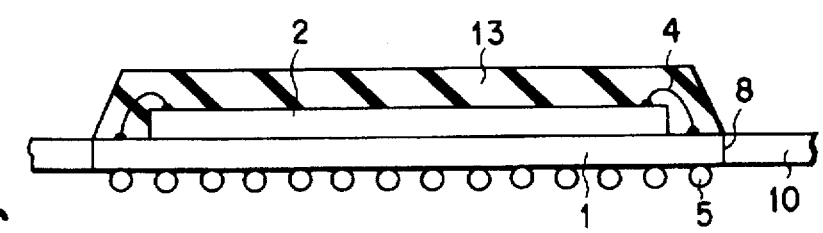

FIGS. 6A to 6C are cross-sectional views illustrating the fabrication steps for the semiconductor apparatus of this invention.

Figure 7:
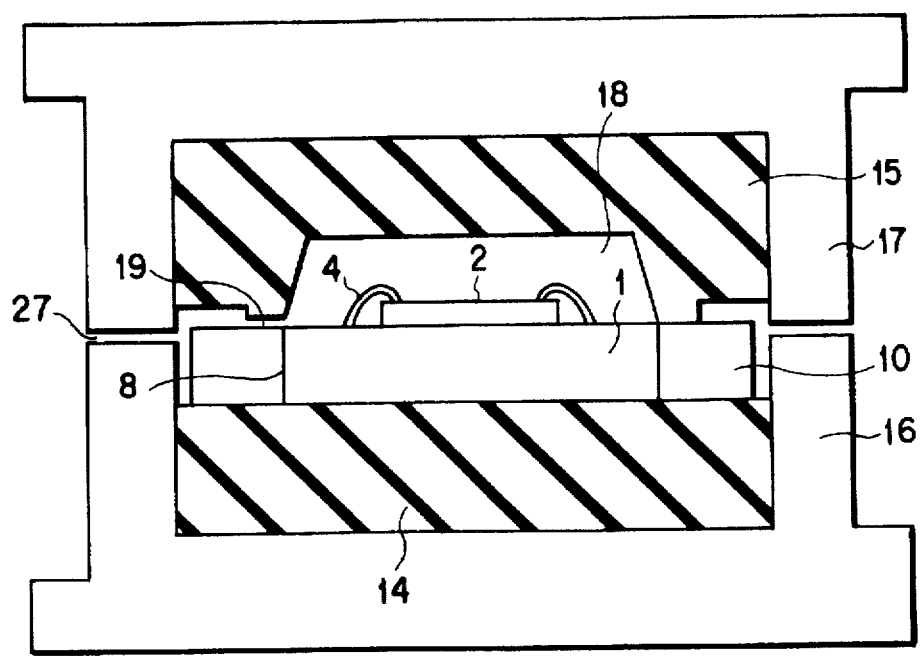
FIG. 7 is a cross-sectional view of a die used in this fabrication process.
Figure 8:
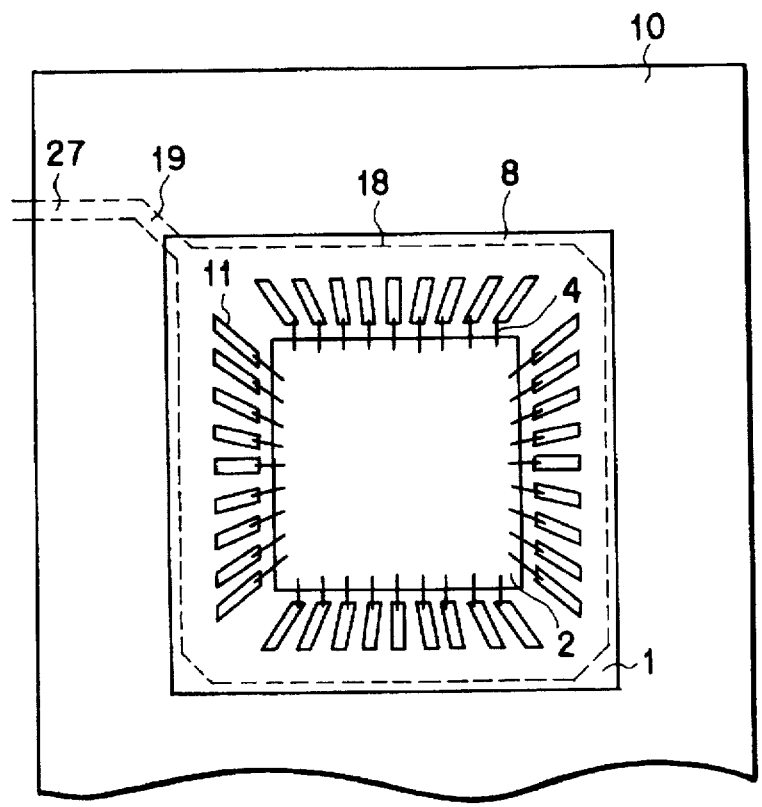
FIG. 8 is a plan view for explaining the arrangement of the wiring board in the cavity of the die shown in FIG. 7.

FIG. 7 is a cross-sectional view of a die used in this fabrication process, and FIG. 8 is a plan view for explaining the arrangement of the wiring board in the cavity of the die.

As the board frame 10, the printed circuit board shown in FIG. 2 is prepared (FIG. 5A). There are a plurality of wiring board areas laid out on the board frame 10 at some intervals. A wiring pattern (not shown) such as inner leads is formed on the main surface of each wiring board area.

Next, the board frame 10 is subjected to punching to punch out the wiring boards with a die and punches, yielding a plurality of wiring boards 1 (FIG. 5B).

The punched-out wiring boards 1 are pushed back to the wiring board 10 by predetermined force (F) (FIG. 5C). Thereafter, the area like a corner of the wiring board 1 which lies along the push-back line 8 and where the wiring pattern is not formed is pressed to form a temporary tacking section. This temporary tacking section should not necessarily be formed.

Next, the semiconductor device 2 is mounted on the island of the wiring board 1 and is secured there by an adhesive or the like, as shown in FIG. 6A. The connection electrodes (not shown) which are exposed through the surface of the semiconductor device 2 and the inner leads (not shown) on the main surface of the wiring board 1 are electrically connected together via bonding wires 4 of thin gold lines or the like.

With the board frame 10 securely placed in the die, a liquid mold resin is put in the die cavity by the transfer mold and is hardened to form a resin-sealed structure 13 (FIG. 6B).

Then, bump electrodes (solder bumps) 5 like solder portions, which are to be electrically connected to the inner leads to be electrically connected to an external circuit, are formed at the back of the wiring board 1.

The inner leads on the main surface of the wiring board 1 and the solder bumps 5 attached to the back of the wiring board 1 are electrically connected together via the connection electrodes (not shown) which are formed on the inner surfaces of through holes (not shown) in the wiring board 1. The solder bumps 5 are connected to the wiring pattern of a circuit board (not shown) on which another wiring board is mounted (FIG. 6C).

As apparent from the above, the semiconductor apparatus is completed with the wiring board 1 held by the board frame 10.

Finally, this semiconductor apparatus is separated from the board frame 10 as shown in FIG. 3. The solder bumps 5 may be formed after the separation of the wiring board 1 from the board frame 10.

The die used in the transfer molding process will be discussed with reference to FIG. 7.

A cavity 18 of the die consists of a lower cavity block 14 and an upper cavity block 15.

The board frame 10 holding the wiring board 1 is securely placed in the cavity 18. The lower and upper cavity blocks 14 and 15 are respectively secured by a lower cavity holder 16 and an upper cavity holder 17.

The semiconductor device and the bonding wires 4 are laid on the wiring board 1 in the cavity 18. The bonding wires 4 electrically connect the connection electrodes (not shown) of the semiconductor device 2 to the inner leads 11 formed on the main surface of the wiring board inner lead 1.

The upper cavity block 15 is positioned to face the push-back line 8 at the boundary between the pushed-back wiring board 1 and the board frame 10.

The edges of the opening of a recess of the upper cavity block 15, which constitutes the cavity 18, matches with the push-back line 8, but is so illustrated as to be positioned inside the push-back line 8 in FIG. 8.

A mold resin of an epoxy resin or the like is pressed fit in the cavity 18 from outside via a liner 27 and a gate 19, thus forming a resin-sealed structure.

Referring now to FIGS. 9 to 12, the wiring board which is held on the board frame and is provided with temporary tacking sections or reinforcing sections will be described.

Those diagrams are partial plan views of the board frame.

Figure 9:
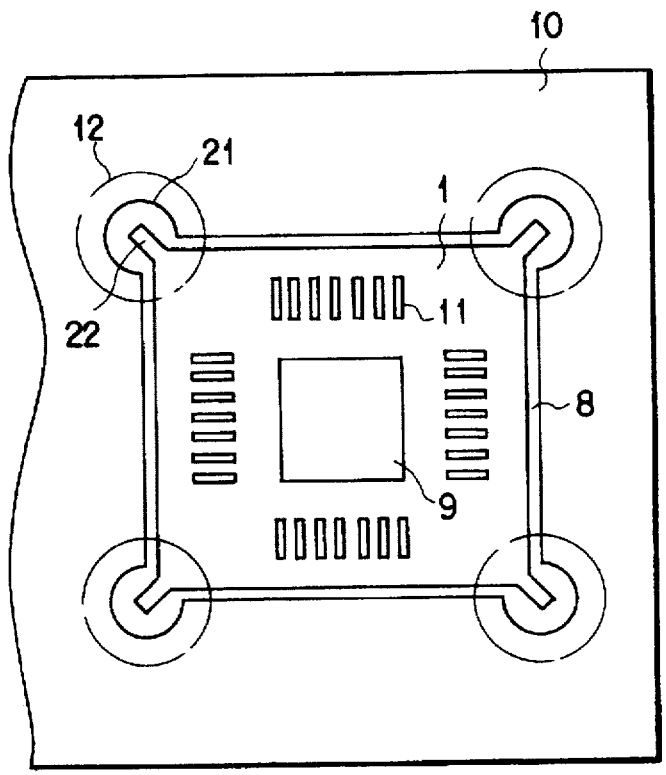
FIG. 9 is a partial plan view of a wiring board which is held on the board frame and is provided with temporary tacking sections.
Figure 10:
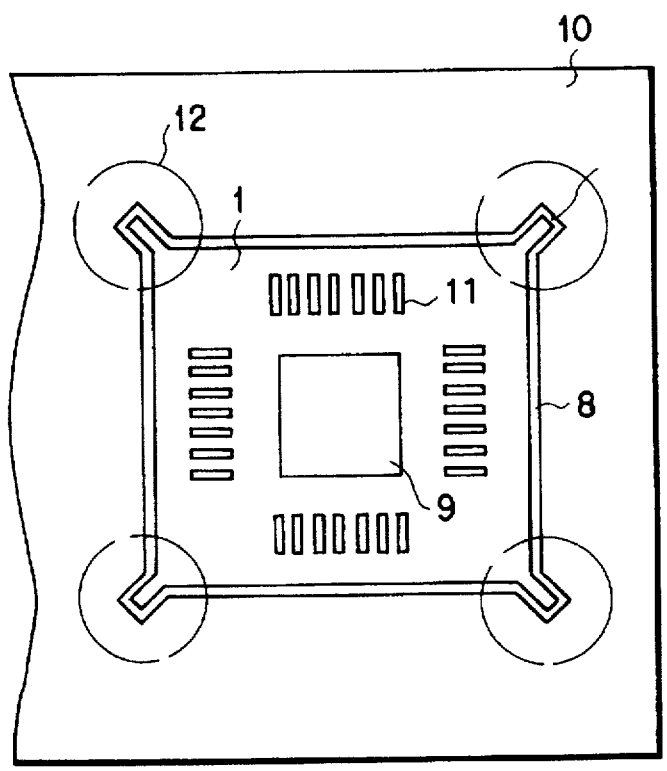
FIG. 10 is a partial plan view of a wiring board which is held on the board frame and is provided with temporary tacking sections different in shape from those in FIG. 9.

In FIG. 9, temporary tacking sections 12 are formed by pressing at the four corners of the wiring board 1 held on the board frame 10 by the push-back technique.

In the diagram, flat portions formed simply by pressing the four corners of the wiring board 1 are fixed as the temporary tacking sections 12 indicated by broken lines.

The wiring board 1 is provided with the inner leads 11 and the island 9 on which a semiconductor device is to be mounted.

Circular notches 21 are formed on the board frame 10 at the temporary tacking sections 12, and projections 22 are formed on the wiring board 1 each at substantially the center of the associated notch 21.

The space between each notch 21 and its associated projection 22 can absorb deformation on the wiring board 1 or the board frame 10 which is produced by the pressure exerted at the time the temporary tacking sections 12 are formed.

This prevents the wiring board 1 from being separated from the board frame by unnecessary stress produced by the deformation. The projections 22 are cut away from the wiring board 1 at the final stage.

In FIG. 11, reinforcing sections 23 using a wax or adhesive are provided at the four non-round corners of the wiring board 1 held on the board frame 10 by the push-back technique.

The wiring board 1 is provided with the inner leads 11 and the island 9 on which a semiconductor device is to be mounted. The locations of the reinforcing sections 23 are not particularly limited to the corners as long as the area of the wiring pattern can be avoided.

FIG. 12 shows another embodiment in which temporary tacking sections 12 are formed by pressing at the four non-round corners of the wiring board 1 held on the board frame 10 by the push-back technique. This embodiment differs from the one shown in FIG. 10 in that the shape of the four corners of the wiring board 1 differs from the portions of the board frame 10 which face those four corners.

The wiring board 1 is provided with the inner leads 11 and the island 9 on which a semiconductor device is to be mounted.

The locations of the temporary tacking sections 12 are not particularly limited to the corners as long as the area of the wiring pattern can be avoided. Both of the reinforcing section 23 shown in FIG. 11 and the temporary tacking section 12 in FIG. 12 may be used.

With reference to FIG. 13, a semiconductor apparatus according to this invention which is connected to a wiring board by flip-chip connection will now be described.

Through holes 25 are formed in the board frame 1 of the semiconductor apparatus shown in FIG. 13. Connection electrodes 26 of a nickel-plated film are formed on parts of the main surface and the back of the wiring board 1 and on the inner surfaces of the through holes 25.

Solder bumps 5 having diameters of about 0.3 to 0.6 mm are formed at the back of the wiring board 1, and are electrically connected to the connection electrodes 26 to be electrically connected to an external circuit.

Solder bumps 24 having diameters of about 80 µm are formed on the connection electrodes (not shown) on the main surface of the semiconductor device 2. The solder bumps 24 are connected to the wiring pattern of a circuit board (not shown) on which another wiring board is mounted.

The connection electrodes 26 on the inner surfaces of the through holes 25 extend to the main surface side of the semiconductor device 2 and are connected to the solder bumps 24.

A resin-sealed structure 13 of an epoxy resin or the like, which is formed by a transfer mold is coated on the semiconductor device 2. As the resin-sealed structure 13 is formed in a die by the transfer mold, its sides are tapered. For example, the taper angle is approximately 30 degrees to the perpendicular direction.

The individual sides of the bottom of the resin-sealed structure 13 are laid out along the respective sides of the wiring board 1 so that their peripheral sides match with each other. That is, the main surface of the wiring board 1 is substantially the same in shape and size as the bottom of the resin-sealed structure 13. If the area of the bottom of the resin-sealed structure 13 becomes larger than the area of the main surface of the wiring board 1 even slightly, the resin-sealed structure 13 is likely to be broken or damaged.

A semiconductor apparatus according to another embodiment of this invention which has connection electrodes 3 formed on sides of a wiring board will now be described with reference to FIGS. 14 and 15.

FIG. 14 is a plan view of this semiconductor apparatus and FIG. 15 is a cross-sectional view as viewed from the direction of the line XV—XV in FIG. 14.

A wiring board 1 is formed from the board frame by the push-back technique.

The connection electrodes 3 of a nickel-plated film or the like are formed on the wiring board 1 along push-back lines 8. The connection electrodes 3 are electrically connected to inner leads 11 formed on the main surface of the wiring board 1.

A semiconductor device 2 is mounted at the center portion of the wiring board 1, and the connection electrodes of the semiconductor device 2 and the inner leads 11 are electrically connected together by bonding wires 4.

The edges of the bottom of a resin-sealed structure 13 which contacts the wiring board 1 are formed along the respective sides of the wiring board 1. That is, the individual sides of the bottom of the resin-sealed structure 13 match with the respective sides of the wiring board 1. The sides of the bottom of the resin-sealed structure 13 which contacts the wiring board 1 are laid out along the respective sides of the wiring board 1 so that their peripheral sides match with each other (FIG. 15).

In other words, the main surface of the wiring board 1 is substantially the same in shape and size as the bottom of the resin-sealed structure 13. If the area of the bottom of the resin-sealed structure 13 becomes larger than the area of the main surface of the wiring board 1 even slightly, the resin-sealed structure 13 is likely to be broken or damaged.

As the push-back type board frame is used in this invention, it is possible to collect good products on a single board frame which carries wiring boards or collect wiring boards of the same quality in the process of assembling the semiconductor apparatus.

The assembling process is therefore performed efficiently. While the thickness of the board frame is approximately 0.45 mm in the embodiments of this invention, the appropriate thickness in the embodiment shown in FIG. 14 is about 0.45 to 0.55 mm.

Although the thickness of the conventional push-back type board frame is about 0.8 mm, this invention can adapted to the process of assembling a semiconductor apparatus to keep sufficient force for holding the wiring board even if the board frame is thinner than the conventional one.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method of fabricating a semiconductor apparatus, comprising the steps of:

forming a plurality of wiring boards each having a wiring pattern and a plurality of connection electrodes electrically connected to said wiring pattern, on a board frame and punching said board frame according to each wiring board to make a plurality of wiring boards;

pushing back said punched-out wiring boards to original positions of said board frame at which time glass fibers at contact surfaces of said wiring boards and said board frame, which have been produced at a time of punching said board frame, are entangled to hold said wiring boards and said board frame;

mounting semiconductor devices on the surfaces of said wiring boards;

electrically connecting said semiconductor devices to said wiring patterns;

forming transfer moldings, covering said surfaces of said wiring boards and said semiconductor devices mounted thereon; and separating said wiring boards from said board frame.

2. A method of fabricating a semiconductor apparatus according to claim 1, wherein said side surfaces of said transfer moldings are inclined by an angle to a perpendicular passing the center of said wiring board.

3. The method according to claim 1, further comprising a step of forming solder bumps at back surfaces of said wiring boards respectively via said connection electrodes before or after said step of separating said wiring boards from said board frame after formation of said transfer moldings.

4. The method according to claim 1, further comprising a step of forming temporary tacking sections for enhancing the holding of said wiring boards in predetermined areas in those areas on boundaries between said board frame and said wiring boards where said wiring patterns are not formed, after said step of bushing back said wiring boards to original positions of said board frame but before said step of securely mounting said semiconductor devices.

5. The method according to claim 1, further comprising a step of forming temporary tacking sections for enhancing the holding of said wiring boards in predetermined areas in those areas on boundaries between said board frame and said wiring boards where said wiring patterns are not formed, after said step of bushing back said wiring boards to original positions of said board frame but before said step of securely mounting said semiconductor devices.

6. The method according to any one of claims 1 to 5, wherein said step of forming said transfer moldings are performed in a die, and said board frame is placed in said die in such a manner that sides of a cavity of said die are arranged along sides of said wiring boards.

* * * * *

UNITED STATES PATENT AND TRADEMARK OFFICE
CERTIFICATE OF CORRECTION

PATENT NO. : 5,731,231
DATED : March 24, 1998
INVENTOR(S) : Kenji MIYAJIMA

It is certified that error appears in the above-indentified patent and that said Letters Patent is hereby corrected as shown below:

Claim 4, Col. 12, line 20, "bushing" should read --pushing--.

Claim 5, Col. 12, line 28, "bushing" should read --pushing--.

Signed and Sealed this

Twentieth Day of July, 1999

Attest:

Q. TODD DICKINSON

Attesting Officer

Acting Commissioner of Patents and Trademarks